United States Patent [19]

Shepherd et al.

[11] 4,288,525
[45] Sep. 8, 1981

[54] PHOTOSENSITIVE MATERIALS

[76] Inventors: John V. Shepherd, 7 Apple Tree Yard, London, England; Eric M. Sutton, P.O. Box 45315 Pemba St., Nairobi, Kenya

[21] Appl. No.: 69,367

[22] Filed: Aug. 24, 1979

[30] Foreign Application Priority Data

Aug. 24, 1978 [GB] United Kingdom ............... 34531/78

[51] Int. Cl.³ ........................ G03C 11/12; G03C 1/76
[52] U.S. Cl. .................................... 430/253; 430/271; 430/273
[58] Field of Search ............... 430/252, 253, 254, 255, 430/271, 273, 15

[56] References Cited

U.S. PATENT DOCUMENTS

| | | | |
|---|---|---|---|
| 3,010,390 | 11/1961 | Buskes | 430/253 |
| 3,091,528 | 5/1963 | Buskes | 430/253 |
| 3,615,435 | 10/1971 | Chu et al. | 430/253 |
| 3,770,438 | 11/1973 | Celeste | 430/253 |
| 4,050,936 | 9/1977 | Takeda et al. | 430/253 |
| 4,081,282 | 3/1978 | Merrill et al. | 430/273 |

Primary Examiner—Richard L. Schilling
Attorney, Agent, or Firm—Darby & Darby

[57] ABSTRACT

Photosensitive materials are described which may be used in a variety of applications such as making dry transfer materials, resist masks, printing plates and silk screen stencils. The material consists of two carrier sheets may be peeled apart and which are laminated together via at least two interlayers viz. a photosensitive layer and an image forming layer. Prior to exposure, if the carrier sheets are peeled apart the carrier sheet adjacent the photosensitive layer separates wholly from it leaving both photosensitive layer and image forming layer on the other carrier sheet. After exposure, if the sheets which are peeled apart the whole of the photosensitive layer and at least part of the image forming layer remains attached to the carrier sheet adjacent the photosensitive layer.

By incorporating adhesive in or adjacent the shearable image forming layer, the photosensitive material may constitute a material from which dry transfers may be manufactured simply by imagewise exposure and peeling apart.

14 Claims, 5 Drawing Figures

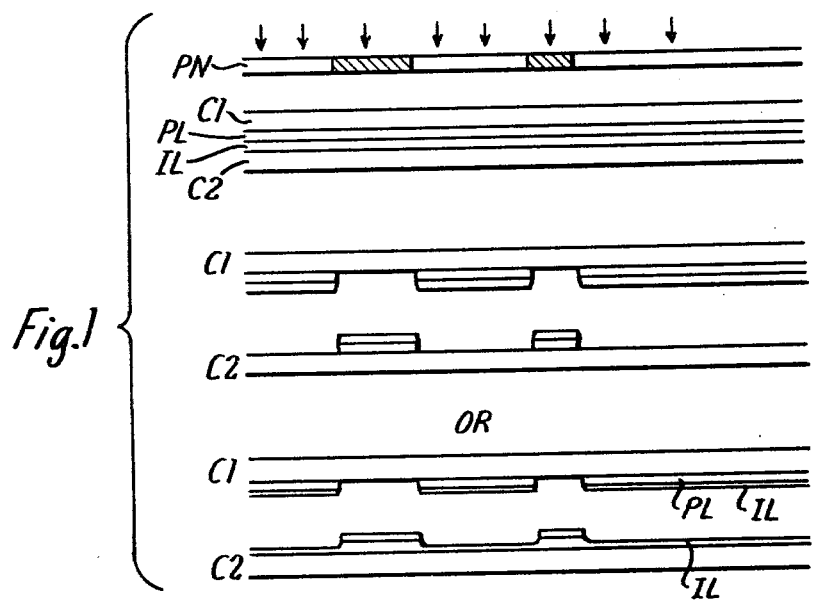
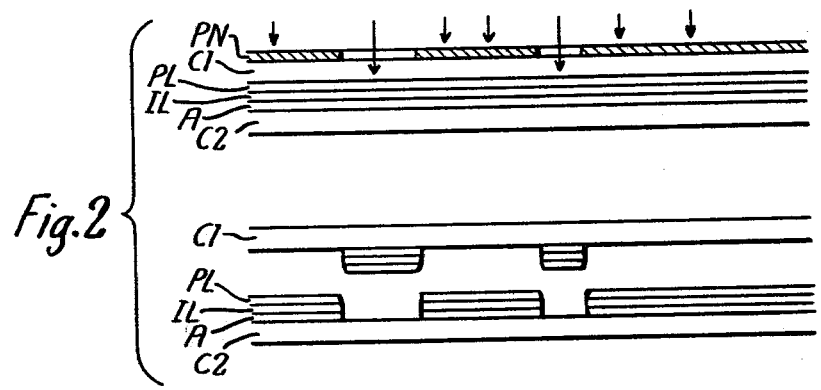
Fig.1
Fig.2

PHOTOSENSITIVE MATERIALS

This invention relates to photosensitive materials and their uses and particularly to photosensitive materials which, after imagewise exposure, can be treated very simply to give reproduced images, development of the image being mechanical rather than chemical.

U.S. Pat. No. 3,353,955 discloses a three-layer material comprising two flexible films separated by a very thin film of a photopolymerisable composition. The cohesion of that composition, in both exposed and unexposed states, is greater than its adhesion to either of the flexible films, but in its unexposed state, it adheres to one film stronger than the other and in its exposed state it adheres to the other stronger than to the one. Accordingly, such a material may be developed after imagewise exposure by simply peeling apart the two substrates, exposed portions of the interlayer adhering to one and unexposed portions adhering to the other.

Such a system is not without disadvantages hindering its practical application. If the image is to be visible, the photopolymerisable interlayer must be coloured, but the introduction of a dye or pigment into that layer renders it more difficult to effect photopolymerisation in exposed areas thereof. Also, if there is too little dye or pigment, the images formed are of low opacity. Increasing the dye or pigment concentration to offset this leads to a decrease in the speed of the photosensitive layer and to unacceptably long exposure times. In addition, since the layer must shear at the boundaries between exposed and unexposed areas, it must not be too strong i.e. not too cohesive. The delicate balance of adhesive and cohesive properties required for workable material is sometimes difficult to obtain. On top of this, if the layer is too thick, it does not shear very cleanly and edge definition in the images produced is unsatisfactory.

An alternative approach is described in U.S. Pat. No. 3,060,025. In that specification, a method is described in which a photosensitive tacky layer is light cured in parts on imagewise exposure, and uncured parts (which remain tacky or thermally transferable) and an image forming layer e.g. of carbon black on a substrate, may then be caused to give a visible image using a heat transfer stage. The process described is complex and does not lead to images of high optical density.

U.S. Pat. No. 3,615,435 discloses a further approach in which a photohardenable image reproduction element consists of a support, a layer of clear photohardenable material on the support and a layer of coloured photohardenable material on top of the clear photohardenable material. A receptor sheet covers the layer of coloured photohardenable material and after imagewise exposure, peeling support and receptor apart gives rise to positive and negative images. Pigmented photopolymer layers are difficult to cure fully without long irradiation but if long irradiation times are used in exposure, the image definition of such materials becomes unacceptable.

British patent specification No. 1336065 discloses multilayer photosensitive materials which may be constructed as a pair of separable support films separated by a plurality of interlayers, one of which is photosensitive. In that system, the adhesion of a photosensitive layer to its adjacent film may be lowered by exposure to light due to the presence of a gas generating compound in the photosensitive layer. Such a material is not straightforward to manufacture or use.

We have now found that much better results may be obtained and a wide variety of materials of use produced if use is made of a sandwich and peel apart technique as disclosed in the specifications referred to above, but in which:

(a) the photosensitive layer is clear and is separate from an image or image-forming layer, and
(b) exposure to actinic radiation renders the photosensitive layer more cohesive and increases its adhesive relative to one or both of the adjacent layers, sufficiently that imagewise separation occurs on peeling the substrates apart.

British patent specification No. 1532307 discloses a sandwich and peel apart technique in which between the two sheets which may be peeled apart there are two layers, the first of a photopolymerizable material and the second of a frangible non-photopolymerisable image forming layer. Prior to exposure, peeling the sheets apart results in cohesive failure of the photopolymerisable material layer with the whole of the image-forming layer remaining upon the carrier sheet to which it is closest. On exposure to actinic radiation, however, the photopolymerisable layer changes to constitute a hardened portion which, on peeling apart the carrier sheets, pulls away the underlying portion of the image forming layer.

Materials such as those disclosed in British patent specification No. 1532307 may be manufactured without great difficulty but they suffer from a number of disadvantages in use. In particular, cohesive failure of the unexposed photopolymerisable layer leads to unexposed photopolymerisable material on both of the two sheets obtained by peeling the material apart and either must accordingly be subjected to a post-treatment in order to harden the tacky photopolymerisable layer before it can be used.

According to the present invention there is provided a photosensitive material comprising, in order, a first carrier sheet, a photosensitive layer, an image-forming layer and a second carrier sheet, wherein on imagewise exposure of the material and peeling apart of the sheets the image-forming layer is caused to shear imagewise, and wherein, on peeling apart the sheets, prior to exposure, the photopolymer layer and image-forming layer are both retained wholly on the second carrier sheet, and after exposure the photopolymer layer and at least part of the image-forming layer are retained on the first carrier sheet.

When such a material is imagewise exposed and "developed" by peeling apart the first and second carrier sheets, shearing occurs imagewise throughout the whole of the photosensitive layer and at least part of the image-forming layer. Preferably shearing occurs throughout the whole of the depth of both layers.

In both unexposed and exposed areas the photosensitive layer is coherent film, the film in the exposed areas being somewhat stronger than that in the unexposed area.

The photosensitive material of the present invention is of particular value in the production of dry transfer materials, which may be produced directly in one exposure/development step if the shearable image-forming layer contains permanently relatively non-tacky adhesive components sufficient to adhere the image formed onto a desired substrate. In that connection, the dry transfer material so produced may be arranged, by appropriate formulation of the two layers, to work either solely by virtue of the adhesion generated to the desired receptor by the adhesive components in the image-forming layer, which act to overwhelm the bond between the exposed photosensitive layer and the first carrier sheet, or alternatively the photosensitive layer may be so formulated that after exposure it, together with the sheared portion of image-forming layer overlying it, constitutes an indicium which may be released from the first carrier sheet by local manipulation e.g. by rubbing over the rear surface of the first carrier sheet with a stylus, as disclosed in British patent specification No. 959670.

Alternatively to incorporating an adhesive material in the image-forming layer, the adhesive may be incorporated into the photosensitive material as a layer between the image-forming layer and the second carrier sheet, which layer on peeling apart the carrier sheets is retained at least partly on those areas of image-forming layer which are pulled away with the first carrier sheet.

If it is not desired to incorporate adhesive into the photosensitive material itself, after exposure and development by peeling apart, the indicia it is desired to transfer may be supercoated with a conventional dry transfer low tacky pressure sensitive adhesive in known fashion. If after exposure, on peeling apart the image-forming layer is sheared completely at the image edges, both negative and positive images corresponding to the original image to which the material was exposed are produced, one on each carrier sheet. If on the other hand the image-forming layer remains in part on the second carrier sheet on peeling apart, only the first substrate bears an image, and the photosensitive material is negative working.

It is preferred that the carrier sheets are plastics films for ease of handling, though in certain special applications one of them may be rigid. For example, in the production of signs, one carrier sheet may be constituted by a rigid transparent or translucent sheet which will form part of the finished sign and the other by a removable plastics film.

The present invention can also be applied to other areas of the graphic arts, such as producing dry transfer materials, colour proofing materials, screen printing stencils and lithographic plates. For dry transfer materials a permanently tacky adhesive may be incorporated in the image forming layer or in a further layer between the two carrier sheets. For colour proofing the separate layers of the proof can be laminated together using conventional adhesives. The fact that the photosensitive material maybe both positive and negative working is useful in colour proofing applications. In colour proofing applications, it is particularly preferred to use a material having after exposure a U.V. curable adhesive in the unexposed areas. The full proof can then be assembled by laying each colour separation in turn and in register against a receptor, irradiating the image area and then stripping the carrier sheet off to leave the image on the receptor. Another application is in the manufacture of signs. A preferred method is where a U.V. curing adhesive is retained on the image in unexposed areas. Cold lamination allows intimate contact to be made between that image and a rigid transparent substrate, whereafter irradiation through the rigid substrate cures the adhesive enabling the flexible carrier sheet to be peeled off to leave a sign adherent to the rigid transparent substrate, through which it may be viewed and by which it may be protected.

The photosensitive layer should be one in which the action of actinic radiation produces major changes in the bulk mechanical properties of the layer by means of polymerization and/or cross-linking. Typically the layer will comprise a photoinitiator and an unsaturated monomer in order to produce the desired change. The action of light on the photoinitiator produces free radicals which initiate the polymerisation and cross-linking of the monomer, thus changing the bulk mechanical properties of the layer. The photoinitiator can be selected from a very wide range of chemical compounds which absorb radiation to form reactive fragments either by direct fission or by subsequent reduction on irradiation with electromagnetic radiation of the appropriate wavelength. Particularly suitable are aromatic carbonyl compounds such as benzil and its derivatives, acetophenone and its derivatives, benzophenone, benzoin, benzoin ethers, chlorothioxanthones and anthraquinones. Another system of value is to generate a Lewis acid induced polymerization: aryl diazonium salts can be used as initiators in epoxy resin based layers. The advantage of this system is that the wholly ionic mechanism is not oxygen-inhibited and polymerisation continues somewhat after the initial exposure giving good contrast. The photoinitiator can also contain groups which will themselves cross-link unsaturated molecules; molecules containing the azido group are known to do this.

Unsaturated monomers for use in the photosensitive layer can be chosen from the numerous unsaturated polyfunctional acrylates known. Their properties can be modified by the addition of monomers containing only one site of unsaturation.

Further compounds such as pre-polymers and oligomers can be incorporated in the photosensitive layers. A wide range of such compounds is well known from their use in U.V. curing inks. The photosensitive layer should be a solid, semi-solid or gel of cohesive strength sufficient to stay as a whole on the second carrier sheet on peeling apart unexposed areas. It is preferred that the difference between the cohesive strength of the exposed and unexposed areas should be maximised to enable the image to obtain maximum definition. Further additives such as adhesives may be incorporated within the photosensitive layer depending on its end use.

Thus the photosensitive layer will preferably consist of a monomer, photoinitiator and a film-forming binder and/or reactive oligomer with the optional addition of reaction enhancers (e.g. amines, perhalogenated alkanes) and thermal stabilisers (e.g. polyhydric phenols) which act by inhibiting polymerisation. The monomer should be added only in as far as it is retained by the film-forming binder thus enabling the layer to be completely removed from the first carrier sheet on peel apart in the unexposed areas. In formulations where the monomer can be added in large quantities (i.e. where it is fully compatible with the binder in all proportions) then care should be exercised such that the cohesion of the photosensitive layer is maintained during peelapart. Similarly, the combination of initiator monomer and oligomer should be added to the binder only to develop photoadhesion properties and not in excess such that internal cohesive failure occurs. The monomers, initiator and oligomers should be absorbed by the binder such that they are entirely removed from the first carrier sheet in the unexposed areas. The photosensitive layer should thus have as low as possible adhesion to the first carrier sheet in the unexposed state. For the production of dry transfer images the photosensitive layer must adhere to the first carrier sheet after exposure but must also allow release of the image when contacted with a receiving surface. The best way of overcoming this apparent contradiction of the increase in adhesion giving rise to an image which is finally required to release from the surface of the first carrier sheet to which it is adhered under applied pressure e.g. from a stylus, is to have the adhesive face of the image forming layer coated onto a release paper constituting the second carrier sheet while having a photosensitive layer which allows use of the stretch-release principle in the final cured form.

The monomers that can be used for this invention are numerous and many examples are contained in the Patents cited above. Particularly suitable are the polyfunctional liquid acrylates. The initiators can be as stated above. Crosslinkable oligomers are well known from their use in U.V. curing inks. Binders can be selected from a wide range of polymeric materials but must be carefully matched to the monomers, oligomers and initiators and to the supporting substrates since it is the binder which has the major effect on image definition and release. Polyvinyl acetates, polyvinyl alcohols, polyvinylpyrrolidone and acrylic polymers have been used with working examples as set out in more detail below. The photoinitiator layer should be as thin as is convenient to manufacture and compatible with good image release. A thickness of between 1 and 30μ gives the best results.

The image forming layer is preferably pigmented and contains a binder such as a resin, polymeric film-former or a gum. Inert mineral solids such as glass, silica, alumina and asbestos may be incorporated in the image forming layer and polymers and/or polymer beads can be incorporated which a post-treatment can fuse or cure for specific purposes. The image-forming layer may also be a vacuum deposited layer of metal. The image forming layer should have a minimum cohesive strength compatible with its peel-apart function and can be made to yield an adhesive surface by the addition of permanently tacky polymeric adhesives. It should have a strong adhesion to the second carrier sheet compatible with the adhesive properties of the photosensitive layer. The first carrier sheet should be transparent and can be selected from any of the flexible plastics materials transparent to U.V. light, notably polyethylene terephthalate, polyethylene, polystyrene and acetate films. The surface adhesive properties of this transparent film can be adjusted by using a subbing layer. Second carrier sheets can be selected from a wide range of papers and plastics. When the end material is to be a dry transfer the preferred second carrier sheet is a flexible paper or plastics film coated with a non-transferable releasing layer such as a silicone based polymer.

The manufacture of the photosensitive materials according to the present invention is straightforward and use may be made of any appropriate coating technology to apply the appropriate coatings to the substrate materials in the appropriate order. It is found particularly convenient to manufacture the materials by coating both carrier sheets and then laminating the two coated sheets together to form the final four or more layer material. Thus in the simplest embodiment, one carrier sheet is coated with a photosensitive composition and the other with an image forming layer. The two carrier sheets are then brought together e.g. in a simple pressure nip between two rollers to laminate them together.

The invention is illustrated and certain specific systems described in more detail with reference to the accompanying drawings in which FIG. 1 shows generally the construction of a photosensitive material according to the present invention and diagrammatically shows what may happen when it is exposed and developed by peeling the carrier sheets apart;

FIG. 2 shows a photosensitive material for making a dry transfer material;

Referring first to FIG. 1, a simple two-carrier sheet, two-interlayer construction of a photosensitive material according to the present invention is shown. The photosensitive material consists of a first clear carrier sheet C1, e.g. of polyethylene terephthalate film which is laminated to a second clear carrier sheet C2, e.g. also a polyethylene terephthalate film, by means of a photopolymerisable layer PL and a shearable image-forming layer IL. The layer IL may be rendered visible e.g. by the incorporation of carbon black in its formulation.

The photosensitive material is shown as below a photographic negative PN having a pair of non-light transmitting areas in a generally light transmitting area. The photosensitive material is contact exposed therewith to the irradiation from a generally parallel beam of light. Following exposure and peeling apart, the weakest link of the chain, originally the adhesion of the photosensitive layer PL to the first carrier sheet C1 has become stronger than the adhesion of the shearable imaging layer IL to the second carrier C2 (as shown in the middle of FIG. 1) or than the cohesion of the shearable imaging layer IL (as shown at the bottom of FIG. 1). It can be clearly seen that the material produces in the former case a positive working and a negative working imaged material.

FIG. 2 shows a photosensitive material as shown in FIG. 1 but with the inclusion of an additional adhesive interlayer A between the imaging layer IL and the second carrier sheet C2. On exposure and peel-apart, carrier C1 bears a plurality of images each of which consists of an exposed photosensitive layer, an imaging layer and an outer layer of adhesive. By formulating the adhesive and photosensitive layers appropriately, such an exposed material is a dry transfer material and the individual images may be selectively transferred to a desired receptor surface on to which they are held by adhesive layer A, by laying sheet C1 plus images on to the desired receptor and rubbing over the back of sheet C1 with a stylus in the area of the images it is desired to transfer.

Figure 3:
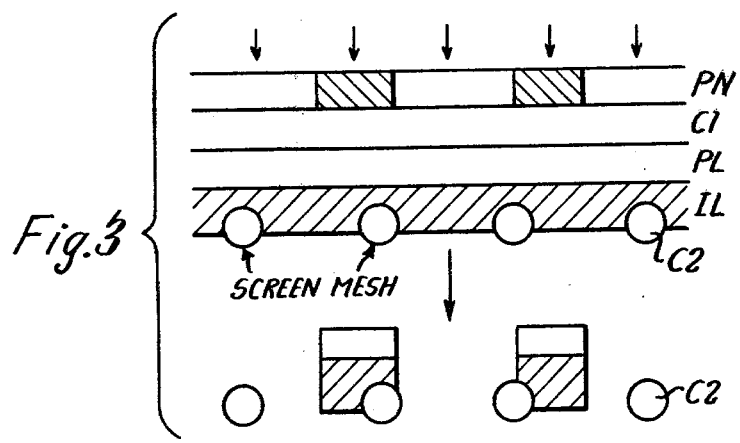
FIG. 3 shows the present invention applied to the manufacture of a screen printing stencil.

FIG. 3 shows the application of a similar system to the production of a screen printing mesh. The shearable image forming layer IL is now partly incorporated into the screen mesh as shown in this Figure, which mesh is carrier C2. On exposure through an image transparency PN, the cohesion of the photopolymer layer to sheet C1 increases sufficiently that, when the clear substrate C1 is peeled away after exposure, it leaves image areas on the screen mesh only in the unexposed portions. Residual photosensitive layer PL may on those mesh portions then be irradiated appropriately to cause hardening of the residues of that layer on the screen mesh and accordingly to cause the formation of a fully cured highly abrasion resistant image defining area on the screen mesh.

Figure 4:
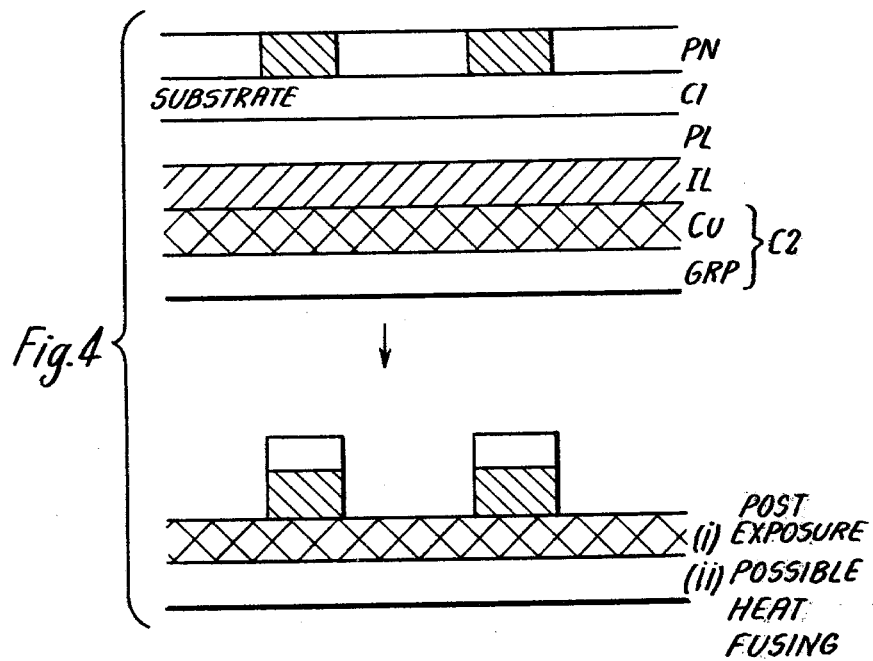
FIG. 4 shows the present invention applied to the manufacture of a printed circuit, and FIG. 5 an indication of how the present invention may be applied to the manufacture of a lithographic printing plate.

FIG. 4 shows the application of the present invention to the manufacture of a printed circuit. In this case the second carrier sheet C2 is constituted by a copper clad board formed of a copper layer Cu on a glass fibre reinforced plastics board GRP. On exposure and peeling off the flexible clear substrate C1, image areas are left on the copper surface in the unexposed portions and these may be hardened, if desired, by subsequent exposure and possible heat treatment, before the board is etched to remove unmasked areas to the Cu layer.

Figure 5:
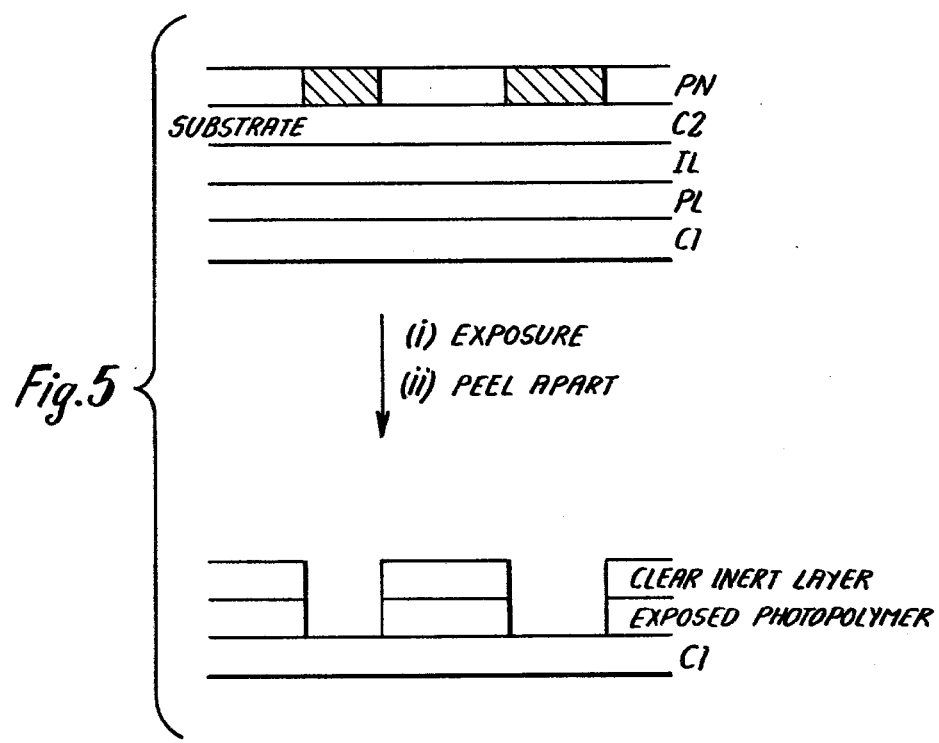

FIG. 5 shows the same system applied to the manufacture of lithographic printing plate. In this case, the shearable image layer IL is transparent and the photopolymerisable layer PL is adjacent the carrier sheet C1 which will form the printing plate. C1 may be, e.g. a metal foil or a plastics film. On exposure, the photosensitive layer PL hardens and holds the clear image forming layer IL on to the plate C1 in the areas wh where it was exposed to light i.e. the plate illustrated is a positive working plate.

The following Examples will serve to illustrate the invention.

EXAMPLE 1

Three premixes were made up as follows:

| Premix A The following materials were mixed together: | |
| --- | --- |
| | Parts by weight |
| 2-isopropylthioxanthone (Quantacure ITX ex Ward Blenkinsop 20% by weight solution in acetone) | 30 |
| 13% w/w 2-isopropylthioxanthone in 2-(Dimethylamino) ethyl benzoate (Quantacure 659 ex Ward Blenkinsop) | 10 |
| nonionic surfactant (HLB = 14; Span 80, ex Honeywill Atlas) | 1 |
| nonionic surfactant (HLB = 4.5; Tween 80, ex Honeywill Atlas) | 2 |

| Premix B The following materials were mixed together: | |
| --- | --- |
| | Parts by weight |
| Acrylate based emulsion polymer which contains functional glycidyl methacrylate grouping capable of crosslinking (Bevaloid 6464 ex Bevaloid Ltd.) | 150 |
| Water | 70 |
| Span 80 (as in Premix A) | 0.2 |
| Tween 80 (as in Premix B) | 0.4 |

| Premix C The following materials were mixed together: | |
| --- | --- |
| | Parts by weight |
| Oligotriacrylate (OTA 480 ex UCB n.v. chemical sector) | 50 |
| Span 80 (as in Premix A) | 0.2 |
| Tween 80 (as in Premix A) | 0.4 |

Premix B (in its entirety) was stirred with a high shear stirrer and 10 parts by weight of premix A was slowly added. Maintaining the stirring premix C was then slowly added to the emulsion of A in B. This emulsion mixture was coated onto 100 micron thick polystyrene sheet using a bar wound with 0.5 mm diameter wire and then dried in an oven at 35° C.

The following were mixed together under high shear using a Silverson mixer:

| | Parts by weight |
| --- | --- |
| Styrene-butadiene copolymer (Pliolite S5B ex Goodyear Chemicals Ltd) | 45 |
| TiO$_2$ pigment (Runa RH472 ex Laporte Industries Ltd) | 270 |
| Toluene | 345 |

This mixture was coated onto 100 micron thick polyethylene sheet using a bar wound with wire of 0.25 mm diameter and allowed to dry at 35° C. The coatings on the polystyrene and polyethylene were laminated together by passing through a nip between two rollers. The laminate was exposed to U.V. light (2 kw mercury halide source at 1 meter for 10 sec.) through an image bearing transparency placed in contact with the polystyrene sheet. The two sheets were then peeled apart. The unexposed photopolymer was removed entirely from the polystyrene by adhering to the pigment layer which itself remained attached to the polyethylene. In the areas exposed to the light the photopolymer adhered to the polystyrene sheet and was fully cured by the UV irradiation. Thus in the exposed areas the cured photopolymer adhered to the polystyrene, the pigmented layer adhered to the cured photopolymer and was removed from the polyethylene (as in the middle of FIG. 1). In this way a positive image of the transparent was produced on the polystyrene.

EXAMPLE 2

The following materials were mixed together with a Silverson mixer:

| | Parts by weight |
| --- | --- |
| Thermoplastic acrylic ester resin (Paraloid A10; 30% solution ex Rohm & Haas) | 25 |
| TiO$_2$ pigment (as in Example 1) | 30 |

This material was coated on 75 micron polyethylene terephthalate sheet (542 Melinex ex I.C.I.) using a bar wound with wire of 0.5 mm diameter and after drying was laminated to the photopolymer on polystyrene described in Example 1. Exposure to U.V. light from a 2 kw mercury-metal halide source at 1 meter for 10 sec. through an image bearing transparency placed in contact with the polystyrene followed by peeling apart of the substrates gave positive and negative images as described in Example 1.

EXAMPLE 3

The following materials were mixed together using a Silverson mixer:

| | Parts by weight |
| --- | --- |
| Chlorinated rubber (Alloprene R10 ex I.C.I.Ltd.) | 37.5 |
| Toluene | 292.5 |

-continued

| | Parts by weight |
|---|---|
| TiO$_2$ pigment (as in Example 1) | 225.0 |

The resulting dispersion was coated on polyethylene terephthalate sheet (as in Example 2) using a bar wound with wire of 0.5 mm diameter. After drying this coating was laminated to polystyrene coated with the photopolymer described in Example 1. Exposing the laminate to U.V. light through a transparency followed by peeling apart the substrates gave images as described in Example 1.

EXAMPLE 4

The following materials were mixed together using a Silverson mixer:

| | Parts by weight |
|---|---|
| Ethylene/vinylacetate copolymer (Elvax 350 ex Du Pont) | 15.0 |
| Toluene | 125.0 |
| TiO$_2$ pigment (as Example 1) | 90.0 |

The resulting dispersion was coated on 100 micron thick polyethylene sheet using a bar wound with 0.5 mm diameter wire and then dried. Using the photopolymer coated polystyrene from Example 1 a laminate was formed which had the imaging properties described in Example 1.

EXAMPLE 5

The following materials were mixed together using a Silverson mixer

| | Parts by weight |
|---|---|
| Styrene-maleic resin (Suprapal AP ex BASF (UK) Ltd. | 30.0 |
| TiO$_2$ pigment (as Example 1) | 150.0 |
| Industrial methylated spirits | 150.0 |

The resulting dispersion was coated on 100 micron thick polyethylene sheet using a bar wound with 0.5 mm diameter wire and then dried. Using the photopolymer coated polystyrene from Example 1 a laminate was formed which had imaging properties similar to those described in Example 1.

EXAMPLE 6

The following materials were mixed together using a Silverson mixer:

| | Parts by weight |
|---|---|
| Polystyrene polymer (Carinex 173 ex Shell Chemicals Ltd. | 45 |
| TiO$_2$ pigment (as Example 1) | 270 |
| Toluene | 585 |

The resulting dispersion was coated on polyethylene terephthalate sheet (as in Example 2) using a bar wound with 0.5 mm diameter wire and then dried. Using the photopolymer coated polystyrene from Example 1 a laminate was formed which had imaging properties similar to those described in Example 1.

EXAMPLE 7

The following materials were mixed together using a Silverson mixer:

| | Parts by weight |
|---|---|
| Ketone resin (CRF 115 ex Laporte Industries). | 75 |
| Industrial methylated spirits | 225 |
| TiO$_2$ pigment (as Example 1) | 450 |

This dispersion was coated on polyethylene terephthalate sheet as in Example 2 using a bar wound with 0.5 mm diameter wire. Using the photopolymer coated polystyrene from Example 1 a laminate was formed which had imaging properties similar to those described in Example 1.

EXAMPLE 8

The following materials were mixed together using a Silverson mixer:

| | Parts by weight |
|---|---|
| Nitrocellulose (DMX 3/5 ex I.C.I. Limited) | 30 |
| TiO$_2$ pigment (as Example 1) | 180 |
| Methyl ethyl ketone | 120 |

This dispersion was coated on 100 micron thick polyethylene terephthalate sheet as in Example 2 using a bar wound with 0.5 mm diameter wire and allowed to dry at 35° C. Using the photopolymer coated polystyrene from Example 1 a laminate was formed which had imaging properties similar to those described in Example 1.

EXAMPLE 9

The following materials were mixed together using a Silverson mixer:

| | Parts by weight |
|---|---|
| Methacrylic polymer solution (Colacryl 1209 ex Cole Polymers Ltd) | 40.0 |
| Xylene | 35.4 |
| TiO$_2$ pigment (as Example 1) | 40.0 |

This dispersion was coated on polyethylene terephthalate sheet as in Example 2 using a bar wound with 0.5 mm diameter and allowed to dry at 35° C. Using the photopolymer coated polystyrene from Example 1 a laminate was formed which had imaging properties similar to those described in Example 1.

EXAMPLE 10

The following materials were mixed together using a Silverson mixer:

| | Parts by weight |
|---|---|
| Hydroxypropyl cellulose (Klucel E ex Hercules Powder Co. Ltd.) | 30 |
| TiO$_2$ pigment (as Example 1) | 180 |
| Industrial methylated spirits | 120 |

This dispersion was coated on polyethylene terephthalate sheet as in Example 2 using a bar wound with 0.5 mm diameter wire and allowed to dry. Using the photopolymer coated polystyrene from Example 1 a laminate was formed which had imaging properties similar to those described in Example 1.

EXAMPLE 11

The following materials were mixed together using a Silverson mixer:

|  | Parts by weight |
|---|---|
| Styrene butadiene copolymer (Pliolite S5E ex Goodyear Chemicals Limited) | 45 |
| Toluene | 225 |
| TiO$_2$ pigment (as Example 1) | 270 |

This dispersion was coated on polyethylene terephthalate sheet (as in Example 2) using a bar wound with 0.5 mm diameter wire and allowed to dry. Using the photopolymer coated polystyrene from Example 1 a laminate was formed which had imaging properties similar to those described in Example 1.

EXAMPLE 12

A laminate was made as described in Example 1, and exposed as described in that Example.

After peeling apart, the image retained on the polyethylene (i.e. the image which has uncured photopolymer on its uppermost surface) was laminated to a 3 mm thick Perspex sheet with the photopolymer layer contacting the Perspex. This laminate was then irradiated with U.V. light from a 2 kw mercury-metal halide source at a distance of 1 meter for 50 sec. Removal of the polyethylene backing left the image firmly adhering to the Perspex sheet, forming a sign in which the image was visible through the sheet and protected from damage by the sheet.

EXAMPLE 13

The following materials were mixed and triple roll milled to Hegman gauge 7.5:

|  | Parts by weight |
|---|---|
| TiO$_2$ pigment (as Example 1) | 57.0 |
| Silica (Aerosil 300 ex Degussa Ltd) | 5.00 |
| 10% solution of polyvinyl alcohol (Moviol 3-83 ex Harlow Chemicals Limited) | 23.5 |
| Water | 14.5 |

35 grams of this mixture were mixed with:

|  | Parts by weight |
|---|---|
| Polyvinyl alcohol (Gohsenol GL03 ex Nippon Gohsei) | 5.0 g |
| Rosin derivative emulsion (Dresinol 902 ex Hercules Powder Company Ltd.) | 5.0 g |
| Water | 5.0 g |

An adhesive was made by mixing the following material in a ball mill:

|  | Parts by weight |
|---|---|
| Low molecular weight polyvinyl isobutyl ether | 35.0 |
| Medium molecular weight polyvinyl isobutyl ether | 40.0 |
| Finely divided silica and adding to the dispersion produced White Spirit/oxitol mixture (90:10 by weight) | 25.0 |
|  | 900.0 |

This adhesive was coated onto siliconised polystyrene butadiene biaxially orientated polymer sheet using a bar wound with 0.25 mm diameter wire. The pigment dispersion described above was coated onto the dried adhesive using a 0.5 mm diameter wire wound bar. The photopolymer described in Example 1 was coated onto siliconised polystyrene butadiene biaxially orientated polymer sheet using a bar wound with 0.5 mm diameter wire. The two substrates were now laminated at room temperature with the pigment layer in contact with the photopolymer layer. The laminate was exposed to U.V. light from a 2 kw mercury-metal halide source at 1 meter for 10 sec. through a negative in contact with the substrate coated with photopolymer. Peeling apart gave a sheet of dry transfer material consisting of the substrate originally coated with photopolymer, and indicia thereon each composed of exposed photopolymer, a white polyvinyl alcohol-based layer and a layer of adhesive thereover.

EXAMPLE 14

The following materials were mixed together to form a solution:

|  | Parts by weight |
|---|---|
| Acrylic oligomer (Ebecryl 600 ex UCB n.v. Chemical sector) | 40 |
| Oligomer acrylate (OTA 480) | 10 |
| Quantacure 659 (as in Example 1) | 6 |
| Ethyl acetate | 20 |
| Methanol | 10 |
| Polyvinylpyrrolidone (30% by weight solution in methanol Luviskol K90 ex BASF) | 17.2 |

This mixture was coated onto 100$\mu$ thick high density polyethylene film using a bar wound with wire diameter 0.63 mm.

The following compounds were mixed together to give a uniform dispersion:

|  | Parts by weight |
|---|---|
| Titanium dioxide pigment dispersion (30% by weight Runa 972 dispersed in water) | 20 |
| Polyvinyl alcohol (Gelvatol 40-10 ex Monsanto) | 6 |
| Polyvinyl acetate (Vinnapas UV 70H ex Wacker-Chemie) | 3 |
| Water | 10 |

An adhesive was prepared as in Example 13 and coated onto 30/111 release paper (30/111 ex Jointings Products Limited) using a bar wound with wire diameter 0.5 mm and the coating dried. The pigment dispersion was then coated onto the dried adhesive layer using a bar wound with 0.5 mm diameter wire. When dried these layers on the release paper were laminated to the photolayer on polyethylene. The laminated material was then exposed to light from a 2 kw mercury-metal halide lamp for 20 sec. through a negative placed in contact with the polyethylene. When the material was then peeled apart images were retained on the polyethylene which had an adhesive surface. In the unexposed areas the photolayer was completely removed. The images on the polyethylene could be transferred, from the sheet by rubbing the back of the sheet with a stylus in the area of the image while the image was in contact with a desired receptor surface.

We claim:

1. A photosensitive material comprising
   a light transmitting first carrier sheet,
   a photosensitive layer comprising at least one member selected from the group consisting of photopolymerizable compositions, photocrosslinkable compositions and mixtures thereof on said first carrier,
   an image-forming non-photosensitive layer on said photosensitive layer, and
   a second carrier sheet in contact with the free surface of said image-forming layer,
   the bond between said second carrier sheet and said image-forming layer prior to exposure of said photosensitive layer to actinic radiation being stronger than the bond between said photosensitive layer and said first carrier sheet and, following exposure to actinic radiation through said first carrier sheet the bond between said photosensitive layer and said first carrier sheet in the light exposed areas being stronger than the bond between said image-forming layer and said second carrier sheet, and
   the exposed portion of said photosensitive layer and at least part of said image-forming layer in contact with said exposed portion of said photosensitive layer are removable along with said first carrier sheet on separating said first and second carrier sheets after imagewise exposure.

2. The photosensitive material of claim 1 wherein the photosensitive layer increases its cohesive strength and its adhesion to the layers on either side thereof on exposure to light.

3. The photosensitive material of claim 1 and including a layer of adhesive between the image-forming layer and the second carrier sheet which, on peeling apart exposed areas of the material, remains attached to the image-forming layer.

4. The photosensitive material of claim 1 wherein the image-forming layer contains permanently adhesive substantially non-tacky components.

5. The photosensitive material of claim 1 wherein the image-forming layer is pigmented.

6. The photosensitive material of claim 1 wherein the image-forming layer is dyed.

7. The photosensitive material of claim 1 wherein the photosensitive layer comprises a light activated free radical generating photoinitiator and an unsaturated monomer.

8. A photosensitive material comprising in order
   a light transmitting first carrier sheet,
   a photosensitive layer on said first carrier sheet comprising at least one member selected from the group consisting of photopolymerizable compositions, photocrosslinkable compositions and mixtures thereof,
   an image-forming non-photosensitive layer on said photosensitive layer, and
   a second carrier sheet in contact with said image-forming layer, the portion of said photosensitive layer that has been imagewise exposed to actinic light and at least part of the image-forming layer in contact with the exposed portion of said photosensitive layer being retained on said first carrier sheet, and
   the unexposed portions of said photosensitive and image-forming layers being wholly retained on said second carrier sheet following imagewise exposure to actinic radiation through said first carrier sheet and subsequent separation of said first and second carrier sheets.

9. The photosensitive material of claim 8 wherein the portions of the photosensitive and image-forming layers that have been exposed to actinic radiation are wholly retained on said first carrier sheet after separation of said first and second carrier sheets.

10. The photosensitive material of claim 9 wherein the photosensitive layer comprises a monomer, a photoinitiator and a film forming binder.

11. The photosensitive material of claim 9 wherein said photosensitive layer comprises a reactive oligomer.

12. A laminated photographic imaging system comprising
    a first polystyrene carrier sheet,
    a photosensitive layer comprising a mixture of 2-isopropyl thioxanthone, a cross-linkable acrylate based polymer and an oligotriacrylate, on said first sheet,
    a pigmented image-forming layer on said photosensitive layer, and
    a polyethylene carrier sheet in contact with the surface of said image-forming layer,
    the bond between said polyethylene carrier sheet and said image-forming layer prior to exposure to actinic radiation being stronger than the bond between said photosensitive layer and said first carrier sheet, the bond between said first carrier sheet and said photosensitive layer in the areas of said photosensitive layer exposed to actinic radiation becoming stronger than the bond between said image-forming layer and said polyethylene carrier sheet in said exposed areas, and the exposed areas of said photosensitive layer and at least a portion of said image-forming layer corresponding to said exposed areas are retained on said first carrier sheet on separating said first carrier sheet and said polyethylene carrier sheet after said exposure.

13. A process for forming an image which comprises the steps of:
    exposing the photosensitive material of claim 1 to actinic radiation, and
    separating said first and second carrier sheets of said photosensitive material so that the exposed portions of said photosensitive layer and at least part of the image-forming layer in contact with the exposed portion of said photosensitive layer are retained on said first carrier sheet and unexposed portions of both said photosensitive and image-forming layers are wholly retained on said second carrier sheet.

14. The process of claim 13 which additionally comprises the step of subsequently releasing said image-forming and photosensitive layers remaining on said first carrier sheet, from said first carrier sheet in the absence of water.

* * * * *